United States Patent
Lee et al.

(10) Patent No.: US 10,305,446 B2
(45) Date of Patent: May 28, 2019

(54) PIEZOELECTRIC OSCILLATOR AND METHOD OF MAKING THE SAME

(71) Applicant: SAMSUNG ELECTRO-MECHANICS CO., LTD., Suwon-si (KR)

(72) Inventors: Jae Sang Lee, Suwon-si (KR); Ho Phil Jung, Suwon-si (KR); Sung Wook Kim, Suwon-si (KR); Tae Joon Park, Suwon-si (KR); In Young Kang, Suwon-si (KR); Dong Joon Oh, Suwon-si (KR); Je Hong Kyoung, Suwon-si (KR); Kyo Yeol Lee, Suwon-si (KR); Jong Pil Lee, Suwon-si (KR); Seung Mo Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 330 days.

(21) Appl. No.: 15/179,248

(22) Filed: Jun. 10, 2016

(65) Prior Publication Data
US 2017/0070208 A1   Mar. 9, 2017

(30) Foreign Application Priority Data
Sep. 7, 2015   (KR) .................. 10-2015-0126292

(51) Int. Cl.
*H03H 9/02*   (2006.01)
*H03H 9/19*   (2006.01)
*H03H 3/02*   (2006.01)

(52) U.S. Cl.
CPC ............ *H03H 9/19* (2013.01); *H03H 3/02* (2013.01); *H03H 9/02023* (2013.01); *H03H 9/02157* (2013.01); *H03H 2003/022* (2013.01)

(58) Field of Classification Search
CPC ........ H03H 9/17; H03H 9/19; H03H 9/02157; H93H 9/02023
See application file for complete search history.

(56) References Cited

U.S. PATENT DOCUMENTS

| | | | |
|---|---|---|---|
| 2007/0096596 A1* | 5/2007 | Naito ................. | H03H 3/04 310/320 |
| 2012/0056514 A1* | 3/2012 | Ishikawa ............ | H03H 9/02157 310/344 |
| 2012/0126668 A1* | 5/2012 | Ii ....................... | H03H 3/02 310/357 |

FOREIGN PATENT DOCUMENTS

| | | | |
|---|---|---|---|
| JP | 2008-263387 A | 10/2008 |
| JP | 2010-109526 A | 5/2010 |
| JP | 2014-116977 A | 6/2014 |

\* cited by examiner

*Primary Examiner* — Derek J Rosenau
(74) *Attorney, Agent, or Firm* — NSIP Law

(57) ABSTRACT

A piezoelectric oscillator, and method of making the same, includes an oscillation substrate comprising an oscillating part and a surrounding part, wherein the surrounding part is thinner than the oscillating part, and oscillating electrodes disposed on an upper surface and a lower surface of the oscillating part. The oscillation substrate is configured according to $H=400.59 \times S+1.75 \pm 1.5$, wherein $H=100 \times (T2/T1)$ and $S=T2/(L1-L2)$, wherein L1 represents an entire length of the oscillation substrate, L2 represents a length of the oscillating part, T1 represents a thickness of the oscillating part, and T2 represents a step height between the oscillating part and the surrounding part.

13 Claims, 7 Drawing Sheets

B-B'

PIEZOELECTRIC OSCILLATOR AND METHOD OF MAKING THE SAME

CROSS-REFERENCE TO RELATED APPLICATION

This application claims the benefit under 35 USC 119(a) of Korean Patent Application No. 10-2015-0126292, filed on Sep. 7, 2015 with the Korean Intellectual Property Office, the entire disclosure of which is incorporated herein by reference for all purposes.

BACKGROUND

1. Field

The following description relates to a piezoelectric oscillator and method of making the same.

2. Description of Related Art

A piezoelectric oscillator is a device generating oscillations having a certain frequency through a piezoelectric material oscillating due to a piezoelectric phenomenon occurring when a voltage is applied to the piezoelectric oscillator. Since the piezoelectric oscillator has a stable oscillation frequency, such a device has been used in several core components providing a reference signal value as well as in an oscillation circuit of a computer or a communications device.

A piezoelectric oscillator includes a crystal, an oscillation substrate using the crystal as a base material and an electrode disposed on the oscillation substrate, wherein the oscillation substrate may have various shapes depending on required physical properties.

When a piezoelectric oscillator is formed so that a thickness of the oscillation substrate is gradually reduced from a central portion thereof toward end portions thereof and is in a thickness shear oscillation mode, a damping amount of oscillation displacement in the end portion is increased. Thus, an effect in which oscillation energy is trapped in the central portion of the piezoelectric oscillator may be improved, and frequency characteristics such as a CI value and a Q value, may also be improved. An example of a shape of the piezoelectric oscillator that may accomplish an oscillation energy trapping effect may include a convex shape in which a convex curved surface is formed as a main surface, a bevel shape in which a space between a flat and thick central portion and an edge of an end portion is formed as an inclined surface, and a mesa, or stepped, shape in which a central portion is flat and a surrounding portion of the central portion is thin.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a piezoelectric oscillator includes an oscillation substrate comprising an oscillating part and a surrounding part, wherein the surrounding part is thinner than the oscillating part, and oscillating electrodes disposed on an upper surface and a lower surface of the oscillating part. The oscillation substrate is configured according to $H=400.59\times S+1.75\pm1.5$, wherein $H=100\times(T2/T1)$ and $S=T2/(L1-L2)$, wherein L1 represents an entire length of the oscillation substrate, L2 represents a length of the oscillating part, T1 represents a thickness of the oscillating part, and T2 represents a step height between the oscillating part and the surrounding part.

The oscillation substrate may be an AT-cut crystal.

The x-axis direction of the crystal may be a length direction of the oscillation substrate.

The oscillation substrate may include a first step corresponding to a step between an upper surface of the oscillating part and a first surface of the surrounding part, and a second step corresponding to a step between a lower surface of the oscillating part and a second surface of the surrounding part. The first step and the second step may have a same height.

Terminal electrodes may be disposed on a first surface and a second surface of the surrounding part and connecting electrodes connecting the terminal electrodes to the oscillating electrodes.

In another general aspect, a piezoelectric oscillator includes a lower case, an upper case disposed on the lower case, wherein disposed within the upper case and the lower case is an oscillation substrate having an oscillating part, a surrounding part. The surrounding part is thinner than the oscillating part, and oscillating electrodes are disposed on an upper surface and a lower surface of the oscillating part. Connection electrodes are disposed on an upper surface of the lower case and electrically connected to the oscillating electrodes, and external electrodes are disposed on a lower surface of the lower case and electrically connected to the connection electrodes. The oscillation substrate is configured according to $H=400.59\times S+1.75\pm1.5$, wherein $H=100\times(T2/T1)$ and $S=T2/(L1-L2)$, wherein L1 represents an entire length of the oscillation substrate, L2 represents a length of the oscillating part, T1 represents a thickness of the oscillating part, and T2 represents a step height between the oscillating part and the surrounding part.

An electrode part may include terminal electrodes disposed on a first surface of the surrounding part and connected to the oscillating electrodes. Connection parts may be disposed between the terminal electrodes and the connection electrodes, and electrically connect the terminal electrodes to the connection electrodes.

The oscillation substrate may be an AT-cut crystal.

The x-axis direction of the crystal may be a length direction of the oscillation substrate.

The oscillation substrate may include a first step corresponding to a step between an upper surface of the oscillating part and a first surface of the surrounding part and a second step corresponding to a step between a lower surface of the oscillating part and a second surface of the surrounding part.

The first step and the second step may have a same height.

Connecting electrodes may connect the terminal electrodes to the oscillating electrodes.

In another general aspect, a method of making a piezoelectric oscillator includes forming a resist pattern on upper and lower surfaces of a crystal wafer, etching protrusion parts and surrounding parts from the crystal wafer to form an oscillation substrate, etching an electrode part on the oscillation substrate, and configuring the oscillation substrate according to $H=400.59\times S+1.75\pm1.5$, wherein $H=100\times(T2/T1)$ and $S=T2/(L1-L2)$. L1 represents an entire length of the oscillation substrate, L2 represents a length of the oscillating part, T1 represents a thickness of the oscillating part, and T2 represents a step height between the oscillating part and the surrounding part.

An electrode part may include terminal electrodes disposed on a first surface of the surrounding part and may be connected to the oscillating electrodes. Connection parts may be disposed between the terminal electrodes and the connection electrodes, and may electrically connect the terminal electrodes to the connection electrodes.

The oscillation substrate may include a first step corresponding to a step between an upper surface of the oscillating part and a first surface of the surrounding part, and a second step corresponding to a step between a lower surface of the oscillating part and a second surface of the surrounding part.

The method may further include forming an external electrode on an lower exterior surface of a lower case, forming a via, in the lower case, electrically connected to the external electrode, forming a connection electrode, on the lower case, electrically connected to the via and external electrode, and disposing the oscillation substrate in the lower case, wherein the electrode part on the oscillation substrate is electrically connected to the connection electrode.

Other features and aspects will be apparent from the following detailed description, the drawings, and the claims.

DETAILED DESCRIPTION

Figure 1:
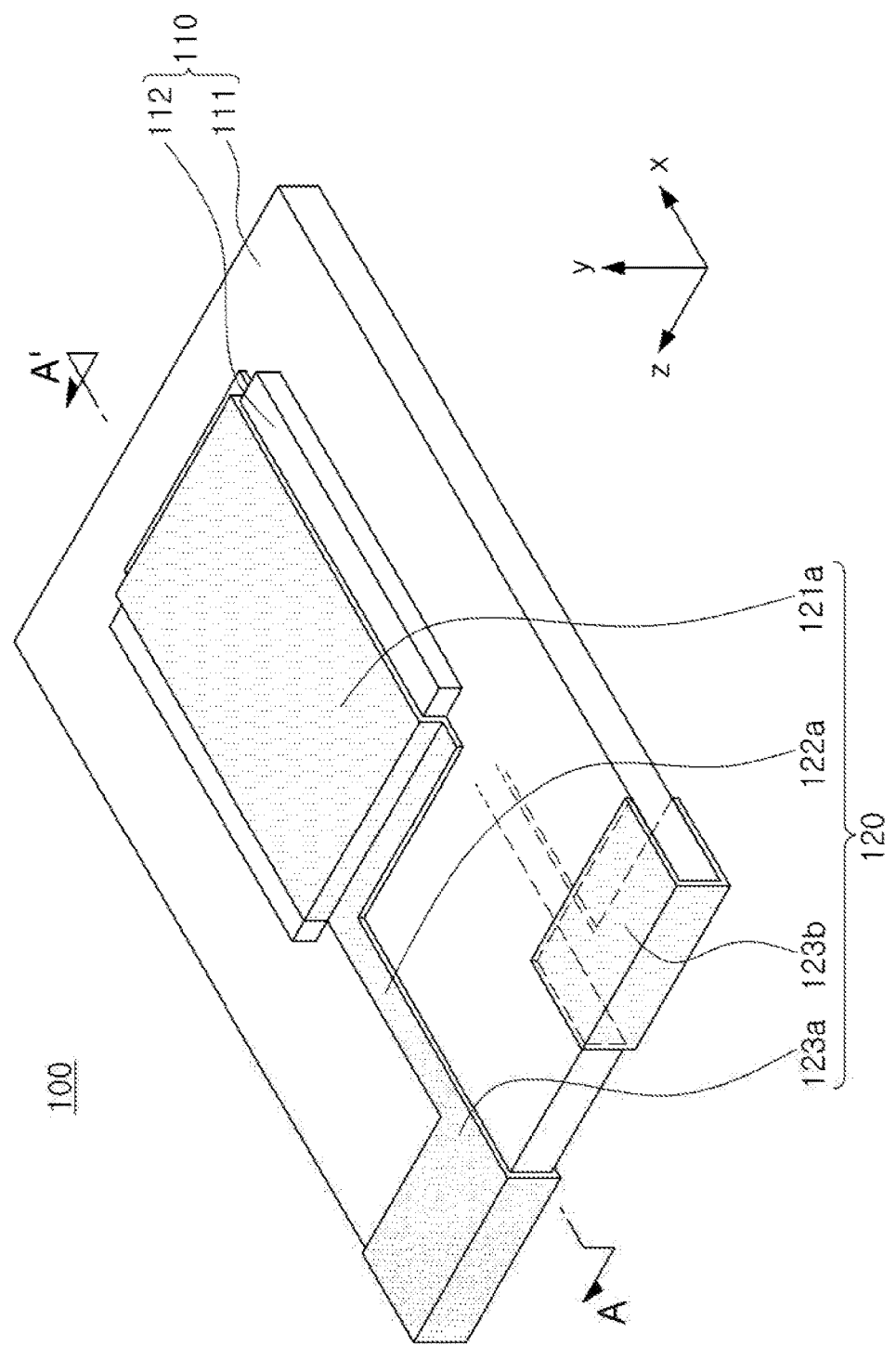
FIG. 1 is a perspective view of a piezoelectric oscillator according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, a piezoelectric oscillator according to an embodiment will be described.

Figure 2:
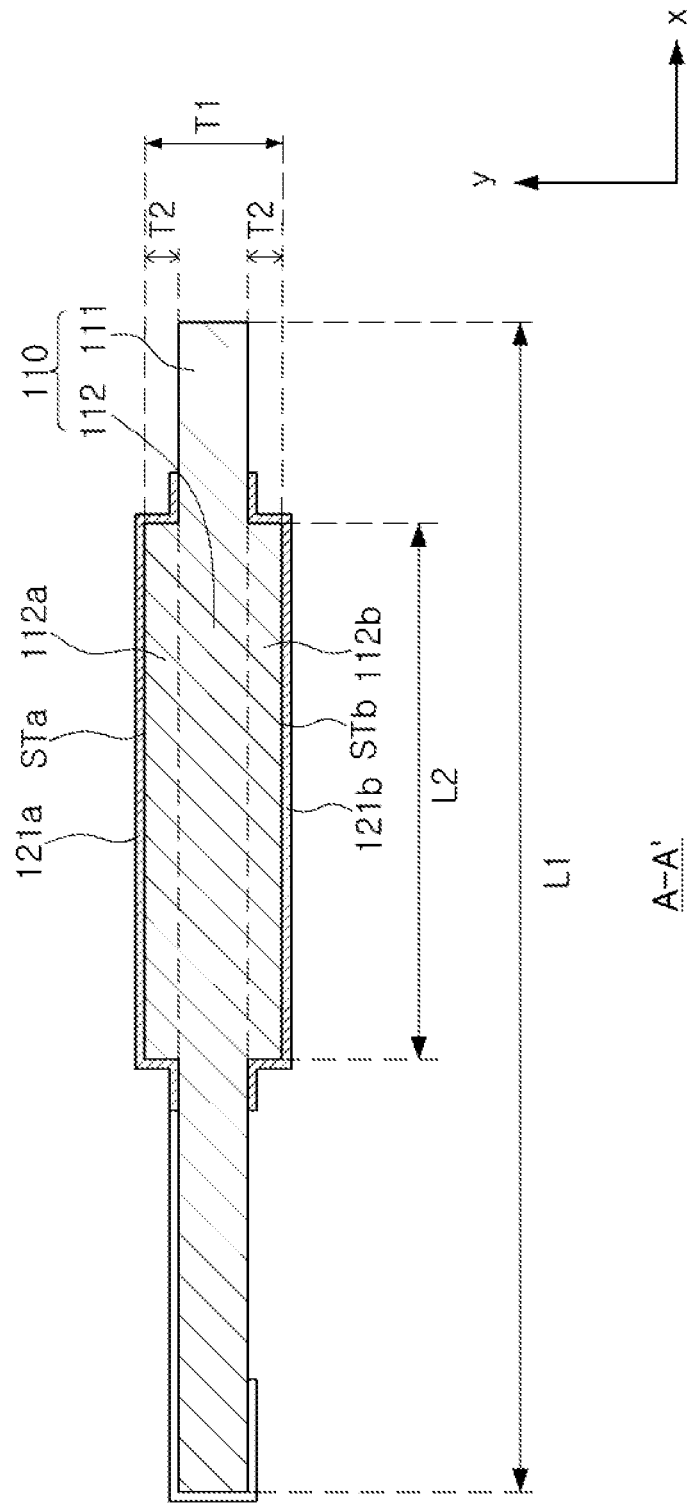
FIG. 2 is a cross-sectional view of the piezoelectric oscillator taken along line A-A' of FIG. 1.

FIG. 1 is a perspective view of a piezoelectric oscillator 100 according to an embodiment in the present disclosure. FIG. 2 is a cross-sectional view of the piezoelectric oscillator 100 taken along line A-A' of FIG. 1.

Referring to FIGS. 1 and 2, the piezoelectric oscillator 100 according to an embodiment includes an oscillation substrate 110 and an electrode part 120 disposed on the oscillation substrate 110.

An x-axis direction, a y-axis direction, and a z-axis direction illustrated in FIGS. 1 and 2 refer to a length direction, a thickness direction, and a width direction of the oscillation substrate, respectively.

According to an embodiment, the oscillation substrate 110 is formed of crystal having an AT-cut, and a length direction (x-axis direction) of the oscillation substrate, which is a long side direction, refers to an x-axis direction of the crystal. The crystal serves as the mechanical oscillation generator. According to one or more embodiments, the crystal may be quartz.

The oscillation substrate 110 includes an oscillating part 112 having a relatively increased thickness and a surrounding part 111 having a thickness less than that of the oscillating part, wherein the oscillating part 112 includes protruding parts 112a and 112b corresponding to regions extending from a first surface and a second surface, respectively, of the surrounding part 111 in a thickness, or y-axis, direction. For example, the protruding parts includes a first protruding part 112a extending further in the y-axis direction, or thickness direction, than the first surface of the surrounding part 111 and a second protruding part 112b extending further in the opposite direction, along the y-axis or thickness direction, than the second surface of the surrounding part 111.

The electrode part 120 includes oscillating electrodes 121a and 121b disposed on the first surface and the second surface of the oscillating part 112, terminal electrodes 123a and 123b disposed on the first surface or the second surface, or both surfaces, of the surrounding part 111, and a connecting electrode 122a connecting the oscillating electrodes 121a and 121b and the terminal electrodes 123a and 123b to each other.

A first oscillating electrode 121a is disposed on an upper surface of the oscillating part 112 and connected to a first terminal electrode 123a through a first connecting electrode 122a, and a second oscillating electrode 121b is disposed on a lower surface of the oscillating part 112 opposite the upper surface and connected to a second terminal electrode 123b through a second connecting electrode.

The first terminal electrode 123a extends along the first surface to a side surface of the surrounding part 111, wraps around the side surface, and extends along the second surface of the surrounding part 111. The second terminal electrode 123b extends from the second surface to the side surface of the surrounding part 111, wraps around the side surface, and extends along the first surface of the surrounding part 111. However, the first terminal electrode 123a and the second terminal electrode 123b are not limited thereto and may be varied.

According to an embodiment, the upper surface and the lower surface STa and STb of the first and second protruding parts 112a and 112b, respectively, may have a substantially quadrangular shape, although they do not have a completely quadrangular shape due to etching of corner portions thereof.

Referring to FIG. 2, L1 refers to an entire length of the oscillation substrate 110 along the x-axis direction of the crystal, L2 refers to a length of the oscillating part 112 measured in the x-axis direction of the crystal. T1 refers to an overall thickness of the oscillating part 112, and T2 refers to a step height between the protruding parts 112a and 112b and the surrounding part 111. A step between the oscillating part 112 and the surrounding part 111 includes a first step at one side of the oscillation substrate 110 in the thickness direction and a second step at the other side of the oscillation substrate 110 in the thickness direction.

A height of the first step refers to a height difference between an upper surface STa of the first protruding part 112a and an upper surface of the surrounding part 111, and a height of the second step refers to a height difference between a lower surface STb of the second protruding part 112b and a lower surface of the surrounding part 111.

According to an embodiment, H=100×(T2/T1), S=T2/(L1−L2), and the oscillation substrate may be provided so that H and S satisfy Equation 1.

$$H = 400.59 \times S + 1.75 \pm 1.5 \qquad \text{[Equation 1]}$$

Here, H is defined as a percentage (%) of the step height to the thickness of the oscillating part. Thus, ±1.5 is considered to be ±1.5% when determining H in Equation 1.

According to one or more embodiments, a correlation between the entire length L1 of the oscillation substrate 110, the length L2 of the oscillating part 112, the thickness T1 of the oscillating part 112, and the step height T2 between the oscillating part 112 and the surrounding part 111 may be derived in consideration of the length L2 of the oscillating part 112 and the step height T2 between the oscillating part 112 and the surrounding part 111 as well as the thickness T1 of the oscillating part 112 and the entire length L1 of the oscillation substrate 110, thereby providing the piezoelectric oscillator 100 having high oscillation performance.

For example, when H=100×(T2/T1) and S=T2/(L1−L2), and H=400.59×S+1.75±1.5% in the oscillation substrate, a piezoelectric oscillator having low and stable crystal impedance (CI) may be achieved.

According to an embodiment, the first step and the second step may be formed of the same height. In this case, the height T2 of the step may be a half of a thickness difference between the overall thickness oscillating part 112 (e.g. T1) and the surrounding part 111. When the first step and the second step have the same dimensions in the oscillation substrate, an energy trapping effect for frequency generation through a piezoelectric effect may be improved, thereby reducing energy loss.

Although side surfaces of the protruding parts 112a and 112b are perpendicular to the upper surface of the oscillating part 112 and the upper surface of the surrounding part 111 in FIG. 2, the side surfaces of the protruding parts are not limited thereto and may be varied. That is, the side surfaces of the protruding parts may be inclined with respect to the upper surface of the oscillating part and the upper surface of the surrounding part. In addition, the side surfaces of the protruding parts may have a single crystal face or two or more crystal faces.

Hereinafter, a method of manufacturing a piezoelectric oscillator according to an embodiment will be described. However, the piezoelectric oscillator is not limited to being manufactured by a method described below, and may be manufactured by various methods.

Figure 3:
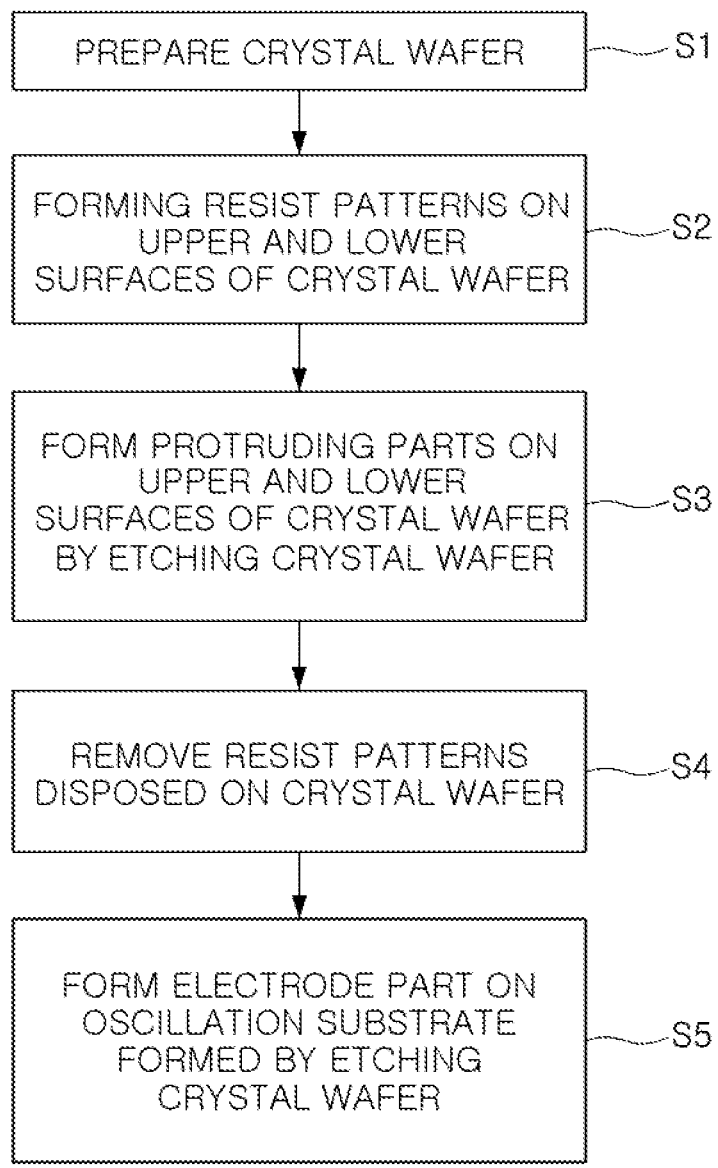
FIG. 3 is a flow chart illustrating a method of manufacturing a piezoelectric oscillator according to an embodiment.

FIG. 3 is a flow chart illustrating a method of manufacturing a piezoelectric oscillator according to an embodiment.

Referring to FIG. 3, the method of manufacturing a piezoelectric oscillator according to an embodiment includes preparing a crystal wafer (S1), forming resist patterns on upper and lower surfaces of the crystal wafer (S2), forming protruding parts on the crystal wafer (S3), removing the resist patterns (S4), and forming an electrode part on a oscillation substrate formed by etching the crystal wafer (S5).

In the preparation of the crystal wafer (S1), a single crystal wafer corresponding to a size of one oscillation substrate may be used, or a plurality of crystal wafers corresponding to the size of one oscillation substrate may be formed on a single crystal wafer assembly.

The crystal wafer is formed by processing rough quartz in a quadrangular or circular shape and then cutting the rough quartz at a predetermined thickness. However, the crystal wafer is not limited a quadrangular or circular shape, and may have various shapes, such as a polygonal shape. A surface polishing process may be additionally performed on the crystal wafer in order to decrease a thickness of the crystal wafer.

Although a plurality of piezoelectric oscillators may be formed using the crystal wafer, a case in which a single piezoelectric oscillator is formed using the crystal wafer will be described by way of example below.

In order to form the protruding parts, resist patterns are formed on one surface and another surface of the crystal wafer (S2). The resist patterns are disposed on the crystal wafer according to the desired shapes and sizes of the protruding parts.

Next, the crystal wafer on which the resist patterns are disposed is etched to form the protruding parts on the one surface and the other surface of the crystal wafer (S3). The crystal wafer may be etched by a chemical etching method by immersing the crystal wafer on which the resist patterns are formed in an etchant.

Here, when the entire length of the oscillation substrate measured in the x-axis direction of the crystal is L1, the length of the oscillating part measured in the x-axis direction of the crystal is L2, the thickness of the oscillating part is T1, the step height between the oscillating part and the surrounding part is T2, $H=100\times(T2/T1)$, and $S=T2/(L1-L2)$, the crystal wafer is etched to form an oscillation substrate wherein $H=400.59\times S+1.75\pm1.5\%$.

Next, an electrode part 120 is formed on the oscillation substrate 110 formed by etching (S5). The electrode part 120 includes the oscillating electrodes 121a and 121b, the terminal electrodes 123a and 123b, and the connecting electrodes 122a. The electrode part 120 may be formed by printing conductive pastes on the oscillation substrate on which the protruding parts 112a and 112b are formed. The electrode part 120 may have the oscillating electrodes 121a and 121b formed on an upper surface and a lower surface of the protruding parts 112a and 112b which make up the oscillation substrate 112.

Next, a piezoelectric oscillator according to another embodiment will be described.

Figure 4:
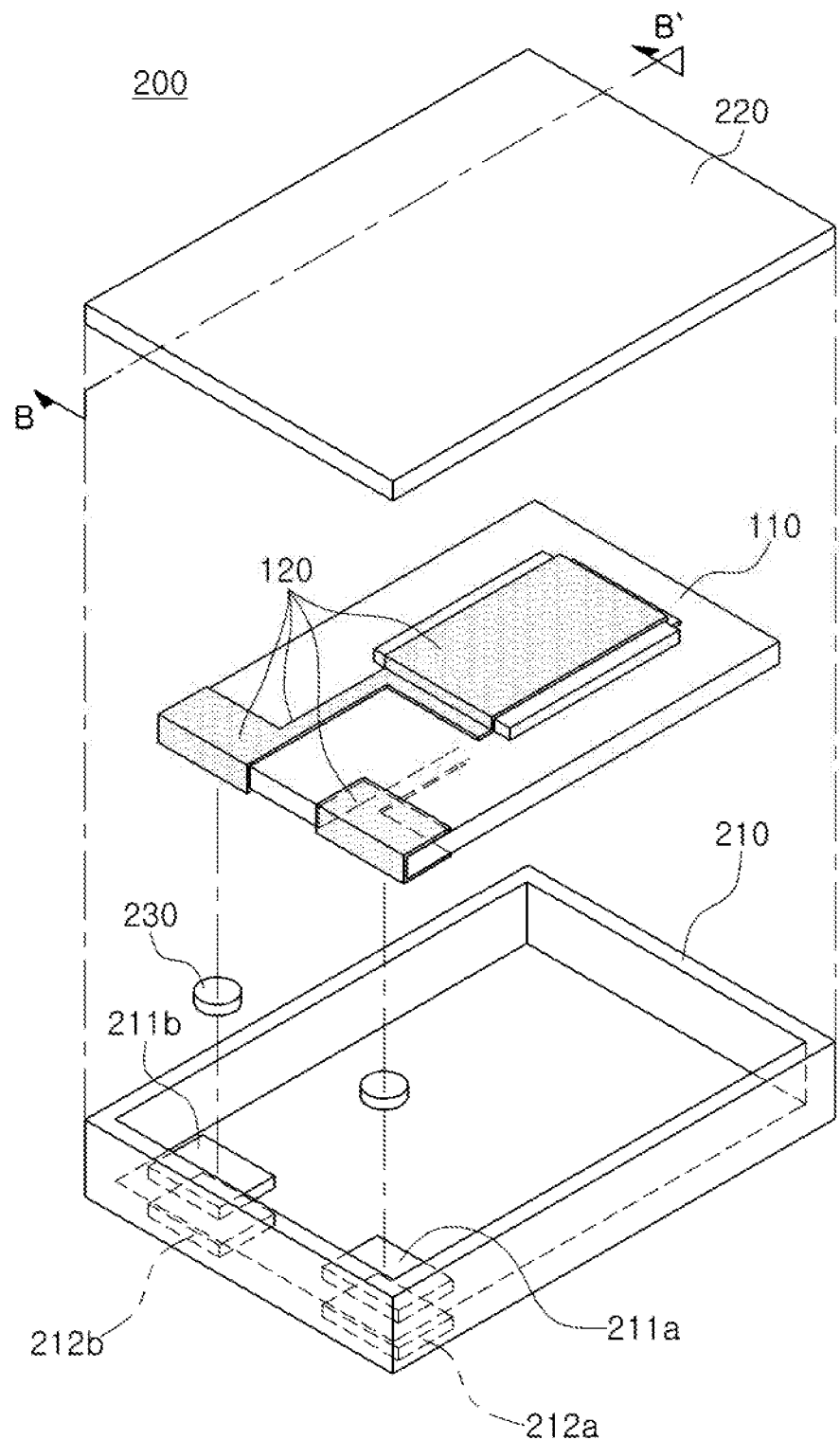
FIG. 4 is an exploded perspective view of a piezoelectric oscillator according to an another embodiment.
Figure 5:
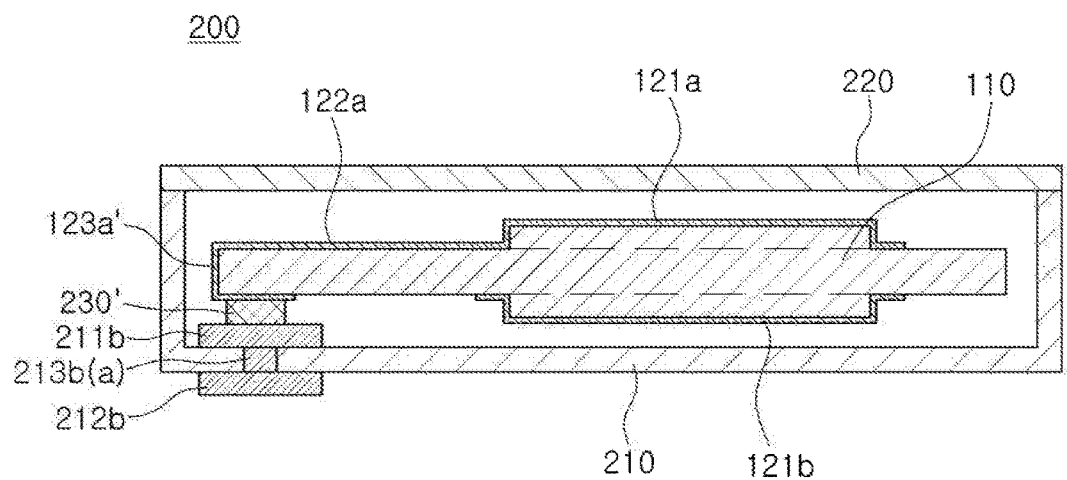
FIG. 5 is a cross-sectional view of the piezoelectric oscillator taken along line B-B' of FIG. 4.

FIG. 4 is an exploded perspective view of a piezoelectric oscillator 200 according to another embodiment; and FIG. 5 is a cross-sectional view of the piezoelectric oscillator 200 taken along line B-B' of FIG. 4.

Referring to FIGS. 4 and 5, the piezoelectric oscillator 200 according to another embodiment includes an oscillation substrate 110 having an electrode part 120, as described above in the previous embodiment, and further includes a lower case 210, an upper case 220, connection electrodes 211a and 211b and external electrodes 212a and 212b.

The lower case 210 and the upper case 220 are coupled to each other to form one case having an internal space, and the oscillation substrate 110 is disposed with in the internal space formed by coupling the upper case to the lower case. The oscillation substrate 110 is disposed in the lower case 210 and the upper case 220 in order to be protected from the external environment.

The connection electrodes include first and second connection electrodes 211a and 211b disposed spaced apart from each other. The external electrodes include first and second external electrodes 212a and 212b spaced apart from each other. The first and second connection electrodes 211a and 211b are disposed on an upper surface of an inner portion of the lower case 210 and connected to the first and second terminal electrodes 123a and 123b of the electrode part 120, respectively.

The first and second external electrodes 212a and 212b are disposed on a lower surface of an outer portion of the lower case 210 and connected to the first and second connection electrodes 211a and 211b, respectively. The first and second external electrodes 212a and 212b and the first and second connection electrodes 211a and 211b are connected to each other by via electrodes 213a and 213b penetrating through the lower case 210, but are not limited thereto, and may be varied.

The first and second external electrodes 212a and 212b may serve as input and output electrodes of the piezoelectric oscillator 200. As described above, when a voltage is applied to the first and second external electrodes 212a and 212b, a voltage may be applied to the first and second oscillating electrodes 121a and 121b of the oscillation substrate 110, and thus the oscillation substrate 110 may vibrate.

The first and second terminal electrodes 123a and 123b of the electrode part 120 and the first and second connection electrodes 211a and 211b are connected to each other by connection parts 230. The connection parts 230 may include solder or conductive adhesive disposed between the first and second terminal electrodes 123a and 123b and the first and second connection electrodes 211a and 211b. The connection parts 230 electrically connect the first and second terminal electrodes 123a and 123b to the first and second connection electrodes 211a and 211b.

The connection part 230 may further include a metal solder. The first and second connection electrodes 211a and 211b and the first and second terminal electrodes 123a and 123b may be connected to each other by disposing the metal solder on the first and second connection electrodes 211a and 211b, disposing the first and second terminal electrodes 123a and 123b on the metal solders, and then performing a reflow process. In addition, the connection parts 230 may be formed by disposing nickel (Ni), gold (Au), or Kovar between the first and second connection electrodes 211a and 211b and the first and second terminal electrodes 123a and 123b and performing arc welding or electron beam welding on a coupling part such as the nickel (Ni), the gold (Au), or the Kovar, or melting gold (Au)-mercury (Hg) at a high temperature. However, the method of forming the connection parts 230 is not limited thereto, and may be varied.

Alternatively, the connection parts 230 may include conductive adhesives that may contain a resin or another organic material, or both. In the case of using a conductive adhesive containing a resin or an organic material, air pressure between the oscillation substrate 110 and the connection electrodes 211a and 211b may be increased, and generation of cracks may be prevented.

The upper case 220 and the lower case 210 may contain the same material, for example, an insulating resin, or the like, but are not limited thereto, and may be varied.

Experimental Example

Figure 6:
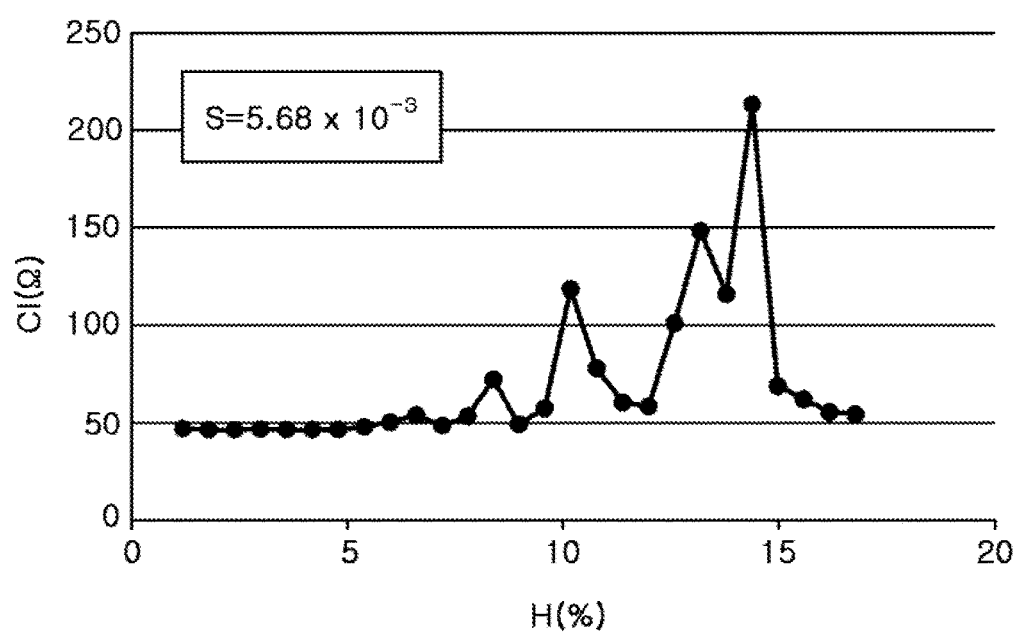
FIGS. 6 through 8 are graphs illustrating simulation results representing a change in crystal impedance (CI) according to a change in an H value with respect to a specific S of a piezoelectric oscillator according to an Experimental Example.
Figure 7:
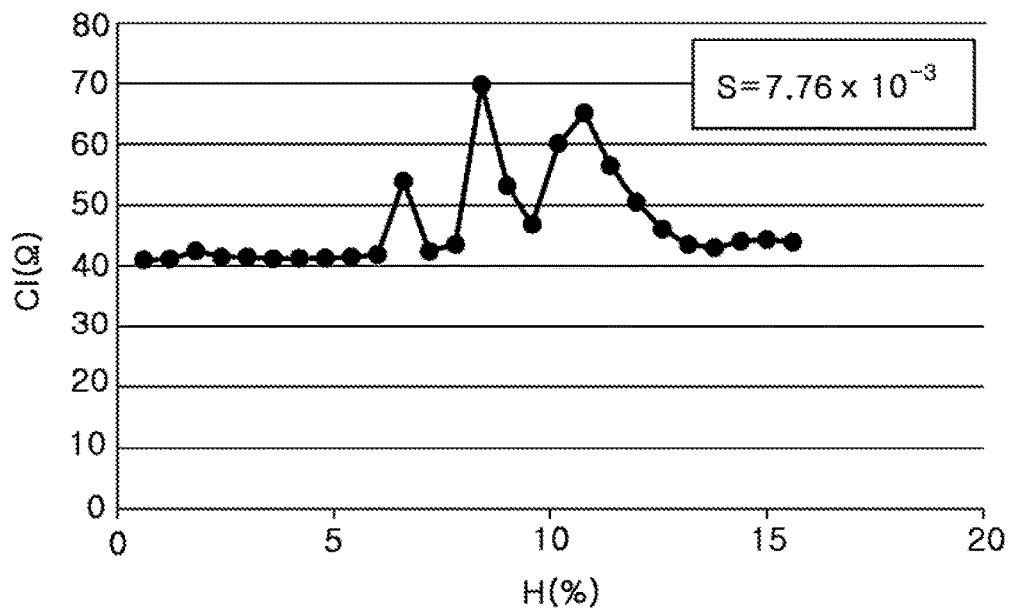
Figure 8:
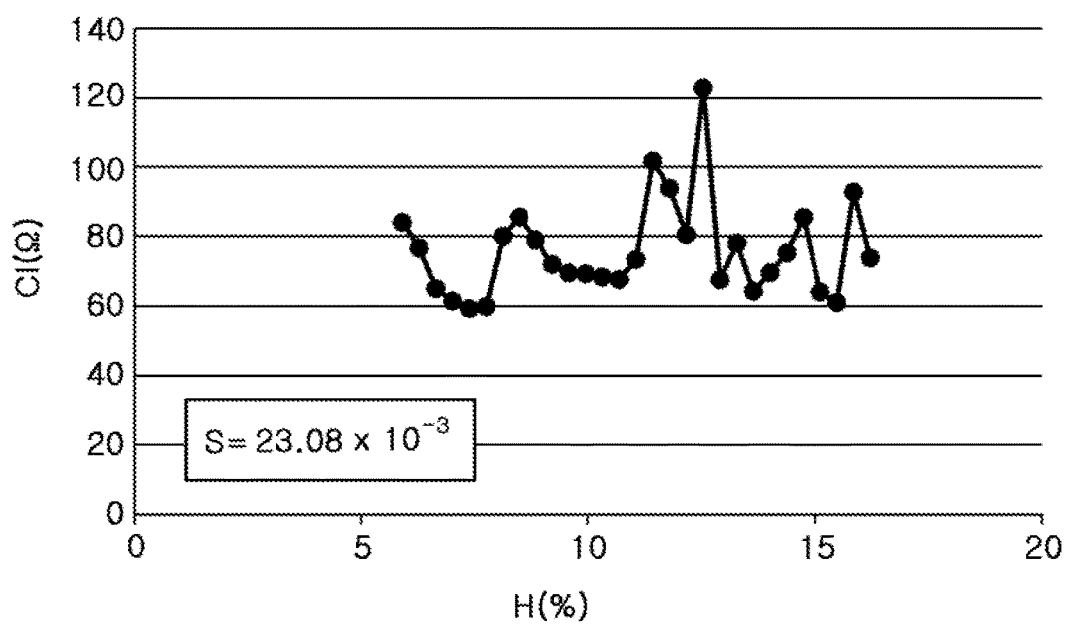

FIGS. 6 through 8 are graphs illustrating simulation results representing a change in crystal impedance (CI) depending on a change in an H value with respect to a specific S when the entire length of the oscillation substrate measured in the x-axis direction of the crystal is L1, the length of the oscillating part measured in the x-axis direction of the crystal is L2, the thickness of the oscillating part is T1, the step height between the oscillating part and the surrounding part is T2, $H=100\times(T2/T1)$, and $S=T2/(L1-L2)$.

Referring to FIG. 6, when S is $5.67\times10^{-3}$, H represents low and stable crystal impedance (CI) in the vicinity of 4.08.

Referring to FIG. 7, when S is $7.76\times10^{-3}$, H represents low and stable crystal impedance (CI) in the vicinity of 4.79.

In addition, referring to FIG. 8, when S is $23.08\times10^{-3}$, H represents low and stable crystal impedance (CI) in the vicinity of 11.06.

Figure 9:
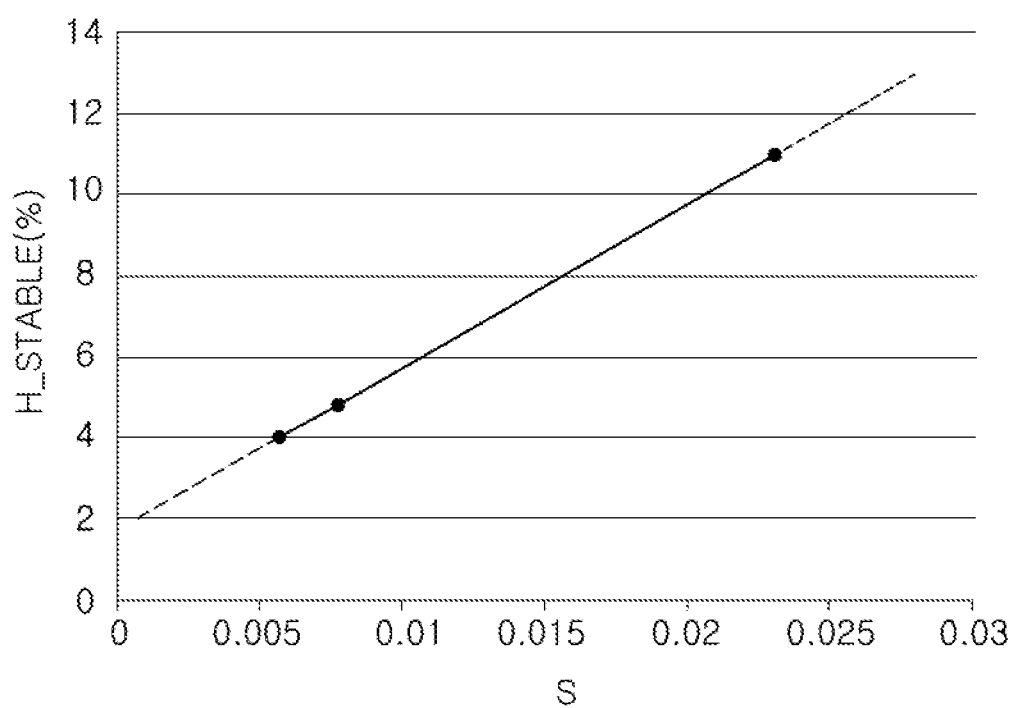
FIG. 9 is a graph illustrating a relationship of an H value representing a stable crystal impedance (CI) value according to an S value.

FIG. 9 is a graph, derived from the results of FIGS. 6 through 8, illustrating a relationship of an H value representing stable crystal impedance (CI) value according to on an S value. Referring to FIG. 9, when a horizontal axis is S and a vertical axis is H, an oscillation substrate having low and stable crystal impedance is provided according to the graph of $H=400.59\times S+1.75$.

Since a crystal impedance tends to be low and stable in a range of ±1.5% in the graph of $H=400.59\times S+1.75\pm1.5$, when the entire length of the oscillation substrate measured in the x-axis direction of the crystal is L1, the length of the oscillating part measured in the x-axis direction of the crystal is L2, the thickness of the oscillating part is T1, the step height between the oscillating part and the surrounding part is T2, H=100×(T2/T1), and S=T2/(L1−L2), then a piezoelectric oscillator having low and stable crystal impedance may be achieved.

As set forth above, according to one or more embodiments, the piezoelectric oscillator having low and stable crystal impedance, may be achieved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A piezoelectric oscillator comprising:
   an oscillation substrate comprising an oscillating part and a surrounding part, wherein the surrounding part is thinner than the oscillating part; and
   oscillating electrodes disposed on an upper surface and a lower surface of the oscillating part,
   wherein the oscillation substrate is configured according to $$[100 \times (T2/T1)] = 400.59 \times [T2/(L1-L2)] + 1.75 \pm 1.5,$$

wherein L1 represents an entire length of the oscillation substrate, L2 represents a length of the oscillating part, T1 represents a thickness of the oscillating part, and T2 represents a step height between the oscillating part and the surrounding part.

2. The piezoelectric oscillator of claim 1, wherein the oscillation substrate is an AT-cut crystal.

3. The piezoelectric oscillator of claim 2, wherein the x-axis direction of the crystal is a length direction of the oscillation substrate.

4. The piezoelectric oscillator of claim 1, wherein the oscillation substrate comprises a first step corresponding to a step between an upper surface of the oscillating part and a first surface of the surrounding part, and a second step corresponding to a step between a lower surface of the oscillating part and a second surface of the surrounding part.

5. The piezoelectric oscillator of claim 4, wherein the first step and the second step have a same height.

6. The piezoelectric oscillator of claim 1, further comprising terminal electrodes disposed on a first surface and a second surface of the surrounding part and connecting electrodes connecting the terminal electrodes to the oscillating electrodes.

7. A piezoelectric oscillator comprising:
   a lower case;
   an upper case disposed on the lower case, wherein disposed within the upper case and the lower case is an oscillation substrate comprising an oscillating part, a surrounding part, wherein the surrounding part is thinner than the oscillating part, and oscillating electrodes disposed on an upper surface and a lower surface of the oscillating part;
   connection electrodes disposed on an upper surface of the lower case and electrically connected to the oscillating electrodes; and
   external electrodes disposed on a lower surface of the lower case and electrically connected to the connection electrodes,
   wherein the oscillation substrate is configured according to $$[100 \times (T2/T1)] = 400.59 \times [T2/(L1-L2)] + 1.75 \pm 1.5,$$

wherein L1 represents an entire length of the oscillation substrate, L2 represents a length of the oscillating part, T1 represents a thickness of the oscillating part, and T2 represents a step height between the oscillating part and the surrounding part.

8. The piezoelectric oscillator of claim 7, wherein an electrode part comprises terminal electrodes disposed on a first surface of the surrounding part and connected to the oscillating electrodes, and
   connection parts are disposed between the terminal electrodes and the connection electrodes, and electrically connect the terminal electrodes to the connection electrodes.

9. The piezoelectric oscillator of claim 7, wherein the oscillation substrate is an AT-cut crystal.

10. The piezoelectric oscillator of claim 8, wherein the x-axis direction of the crystal is a length direction of the oscillation substrate.

11. The piezoelectric oscillator of claim 7, wherein the oscillation substrate includes a first step corresponding to a step between an upper surface of the oscillating part and a first surface of the surrounding part and a second step corresponding to a step between a lower surface of the oscillating part and a second surface of the surrounding part.

12. The piezoelectric oscillator of claim 11, wherein the first step and the second step have a same height.

13. The piezoelectric oscillator of claim 8, wherein further comprising connecting electrodes connecting the terminal electrodes to the oscillating electrodes.

* * * * *